US012634627B2

(12) United States Patent
Fu et al.

(10) Patent No.: US 12,634,627 B2
(45) Date of Patent: May 19, 2026

(54) SPEAKER DISPLACEMENT PROTECTION METHOD AND DEVICE, AND COMPUTER-READABLE STORAGE MEDIUM

(71) Applicant: AAC Technologies (Nanjing) Co., Ltd., Nanjing (CN)

(72) Inventors: Hongling Fu, Nanjing (CN); Ruizhi Lan, Nanjing (CN); Lijian Ye, Nanjing (CN)

(73) Assignee: AAG Technologies (Nanjing) Co., Ltd., Nanjing (CN)

( * ) Notice: Subject to any disclaimer, the term of this patent is extended or adjusted under 35 U.S.C. 154(b) by 212 days.

(21) Appl. No.: 18/403,633

(22) Filed: Jan. 3, 2024

(65) Prior Publication Data

US 2024/0340581 A1 Oct. 10, 2024

Related U.S. Application Data

(63) Continuation of application No. PCT/CN2023/087031, filed on Apr. 7, 2023.

(51) Int. Cl.
| | |
|---|---|
| *H04R 3/00* | (2006.01) |
| *H03G 3/30* | (2006.01) |
| *H04R 3/04* | (2006.01) |

(52) U.S. Cl.
CPC ........... *H04R 3/007* (2013.01); *H03G 3/3078* (2013.01); *H04R 3/04* (2013.01)

(58) Field of Classification Search
CPC .. H04R 3/04; H04R 2430/01; H04R 2499/11; G08B 6/00; G08B 3/10; H03F 3/245; H02N 2/001
USPC ................ 381/162, 163, 164, 120, 121, 123
See application file for complete search history.

(56) References Cited

U.S. PATENT DOCUMENTS

| | | | | |
|---|---|---|---|---|
| 10,149,051 B2 * | 12/2018 | Thyssen | ............... | H03G 3/3005 |
| 2014/0254805 A1 * | 9/2014 | Su | ........... | H04R 3/007 381/55 |
| 2017/0325024 A1 * | 11/2017 | Hu | ......... | H04R 3/007 |
| 2018/0160228 A1 * | 6/2018 | Hu | ........ | H04R 29/001 |
| 2024/0340580 A1 * | 10/2024 | Fu | .......... | H04R 3/007 |

FOREIGN PATENT DOCUMENTS

CN 109495820 B * 4/2021 ............... H04R 9/06

\* cited by examiner

*Primary Examiner* — Xu Mei
(74) *Attorney, Agent, or Firm* — Wiersch Law Group

(57) ABSTRACT
A speaker displacement protection method, a speaker displacement protection device, and a computer-readable storage medium are provided. The speaker displacement protection method includes creating a target transfer function based on a real-time amplitude of the speaker and a fusion voltage relative to the combination device, determining target gains according to the target transfer function and a predetermined displacement threshold, and performing gain processing on an original audio signal input to the combination device based on the target gains, so as to provide displacement protection for the speaker. As such, accuracy of the speaker displacement protection is improved while audio distortion is reduced.

6 Claims, 8 Drawing Sheets

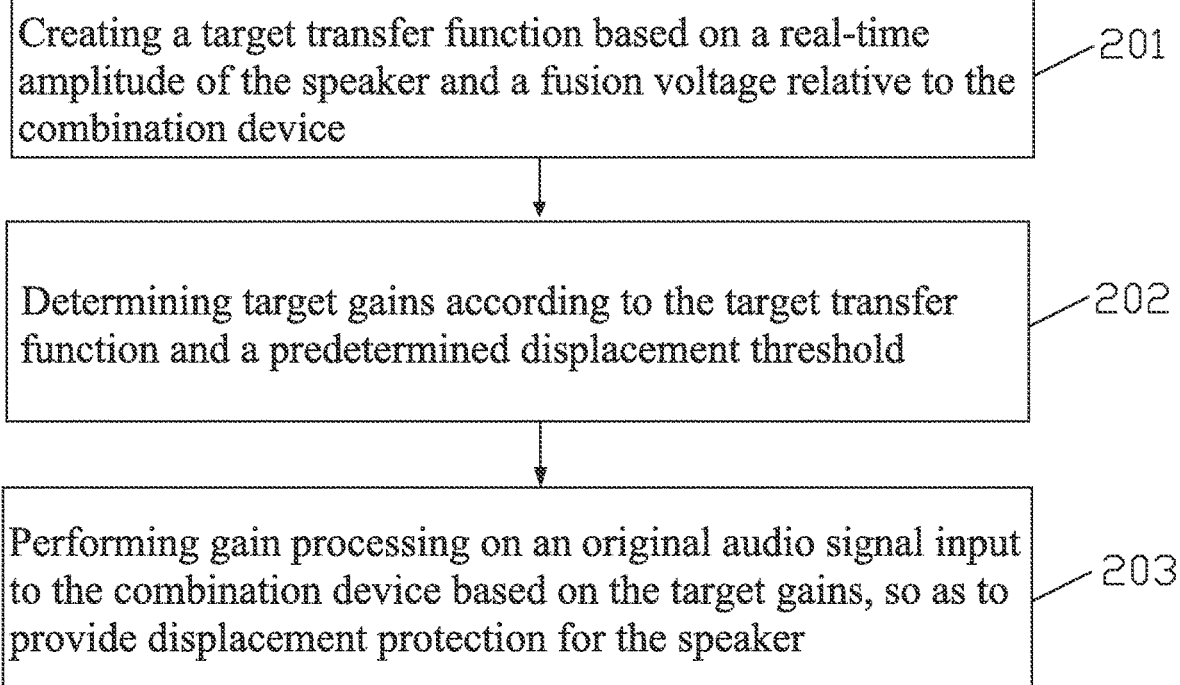

Creating a target transfer function based on a real-time amplitude of the speaker and a fusion voltage relative to the combination device — 201

Determining target gains according to the target transfer function and a predetermined displacement threshold — 202

Performing gain processing on an original audio signal input to the combination device based on the target gains, so as to provide displacement protection for the speaker — 203

FIG. 2

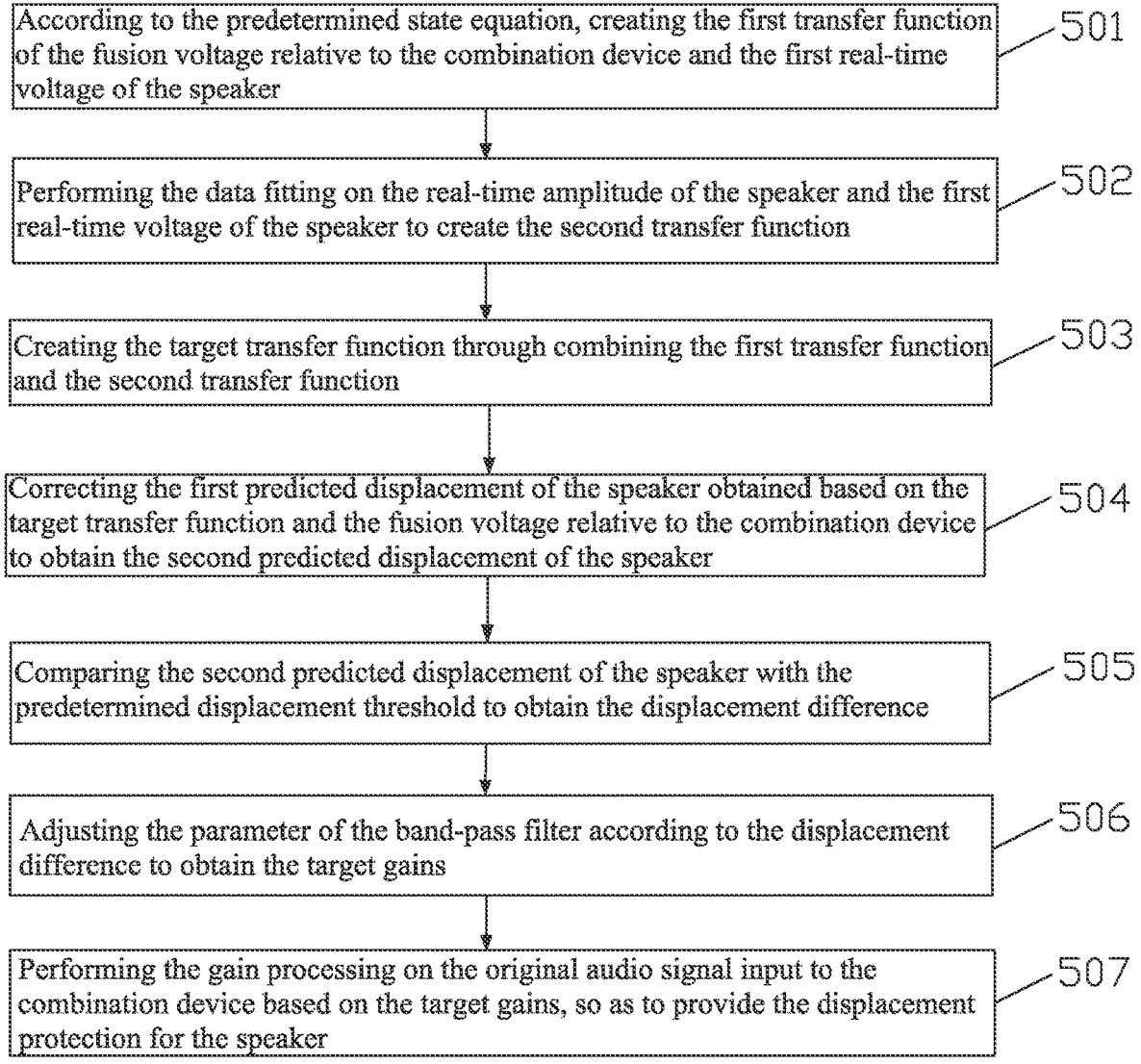

According to the predetermined state equation, creating the first transfer function of the fusion voltage relative to the combination device and the first real-time voltage of the speaker ⌐501

Performing the data fitting on the real-time amplitude of the speaker and the first real-time voltage of the speaker to create the second transfer function ⌐502

Creating the target transfer function through combining the first transfer function and the second transfer function ⌐503

Correcting the first predicted displacement of the speaker obtained based on the target transfer function and the fusion voltage relative to the combination device to obtain the second predicted displacement of the speaker ⌐504

Comparing the second predicted displacement of the speaker with the predetermined displacement threshold to obtain the displacement difference ⌐505

Adjusting the parameter of the band-pass filter according to the displacement difference to obtain the target gains ⌐506

Performing the gain processing on the original audio signal input to the combination device based on the target gains, so as to provide the displacement protection for the speaker ⌐507

FIG. 5

Speaker displacement
protection device

Creating module
701

Determining module
702

Gain processing module
703

FIG. 7

SPEAKER DISPLACEMENT PROTECTION METHOD AND DEVICE, AND COMPUTER-READABLE STORAGE MEDIUM

TECHNICAL FIELD

The present disclosure relates to coaxial speakers, and in particular to a speaker displacement protection method, a speaker displacement protection device, and a computer-readable storage medium.

BACKGROUND

Displacements of vibrating diaphragms of speakers generated due to movements of the speakers are related to input voltages, and in order to ensure that the displacements of the vibrating diaphragms of the speakers do not exceed a maximum displacement to avoid the speakers from being damaged, displacement protection is needed for the speakers. In order to save costs and space, a speaker and a motor are generally driven by one power amplifier after being connected in series in the mobile phone market. However, such a design brings a series of problems, for example, if the speaker is not provided with the displacement protection, a displacement of the speaker under a large signal may exceed actual physical limitation, so that a voice coil of the speaker and a T-yoke of the speaker are collided to generate abnormal sound, and even permanent damage to the speaker is caused. Moreover, using a displacement protection model with a single speaker may cause over-compression, resulting in a relatively large loss on speaker sound loudness.

SUMMARY

The present disclosure aims to provide a speaker displacement protection method, a speaker displacement protection device, and a computer-readable storage medium to at least solve a problem in the related art that accuracy of speaker displacement protection is low and relatively large loss on speaker sound loudness is caused due to forming a displacement protection model with a single speaker.

In order to achieve above aims, in a first aspect, the present disclosure provides a speaker displacement protection method, applied to a device including a power amplifier and a combination device including a speaker and a motor, including:

creating a target transfer function based on a real-time amplitude of the speaker and a fusion voltage relative to the combination device;

determining target gains according to the target transfer function and a predetermined displacement threshold; and performing gain processing on an original audio signal input to the combination device based on the target gains, so as to provide displacement protection for the speaker.

In a second aspect, the present disclosure provides a speaker displacement protection device applied to a device, the device includes a power amplifier and a combination device, and the combination device includes a speaker and a motor. The speaker displacement protection device includes a creating module, a determining module, and a gain processing module. The creating module is configured to create a target transfer function based on a real-time amplitude of the speaker and a fusion voltage relative to the combination device, the determining module is configured to determine target gains according to the target transfer function and a predetermined displacement threshold, and the gain processing module is configured to perform gain processing on an original audio signal input to the combination device based on the target gains, so as to provide displacement protection for the speaker.

In a third aspect, the present disclosure provides a computer-readable storage medium, the computer-readable storage medium includes a computer program, and the computer program is executed by a processor to execute the speaker displacement protection method as foregoing.

Based on above, the present disclosure provides the speaker displacement protection method, the speaker displacement protection device, and the computer-readable storage medium, the speaker displacement protection method includes creating the target transfer function based on the real-time amplitude of the speaker and the fusion voltage relative to the combination device, determining the target gains according to the target transfer function and the predetermined displacement threshold, and performing the gain processing on the original audio signal input to the combination device based on the target gains, so as to provide the displacement protection for the speaker. According to the present disclosure, the target transfer function is created according to an amplitude model of the speaker and the motor, and the target gains are determined according to the target transfer function and the predetermined displacement threshold for performing the gain processing on the original audio signal input to the combination device, so that the accuracy of the speaker displacement protection is improved while audio distortion is reduced.

BRIEF DESCRIPTION OF DRAWINGS

In order to more clearly illustrate embodiments of the present disclosure or technical solutions in the related art, drawings that need to be used in the embodiments or the related art are briefly described below, and it is obvious that the accompanying drawings in following description are merely some embodiments of the present disclosure, and those who skilled in the art may obtain other drawings according to these drawings without involving any inventive effort.

FIG. 2 is a schematic flowchart of a speaker displacement protection method according to the first embodiment of the present disclosure.

FIG. 5 is schematic flowchart of a detailed speaker displacement protection method according to a second embodiment of the present disclosure.

FIG. 7 is a module schematic diagram of the speaker displacement protection device according to a third embodiment of the present disclosure.

DETAILED DESCRIPTION

In order to make objectives, features, and advantages of the present disclosure more obvious and understandable, technical solutions in the embodiments of the present disclosure are clearly and completely described below with reference to accompanying drawings in the embodiments of the present disclosure. Obviously, the described embodiments are merely some embodiments of the present disclosure, rather than all embodiments. All other embodiments obtained by those who skilled in the art based on the embodiments of the present disclosure without creative efforts shall fall within a protection scope of the present disclosure.

In addition, terms "first" and "second" are used for descriptive purposes only and cannot be understood as indicating or implying relative importance or implicitly indicating the number of indicated technical features. Thus, features defined with "first" and "second" may explicitly or implicitly include one or more of the features. In the description of the embodiments of the present disclosure, a meaning of "a plurality of" is two or more, unless specifically defined otherwise.

Figure 1:
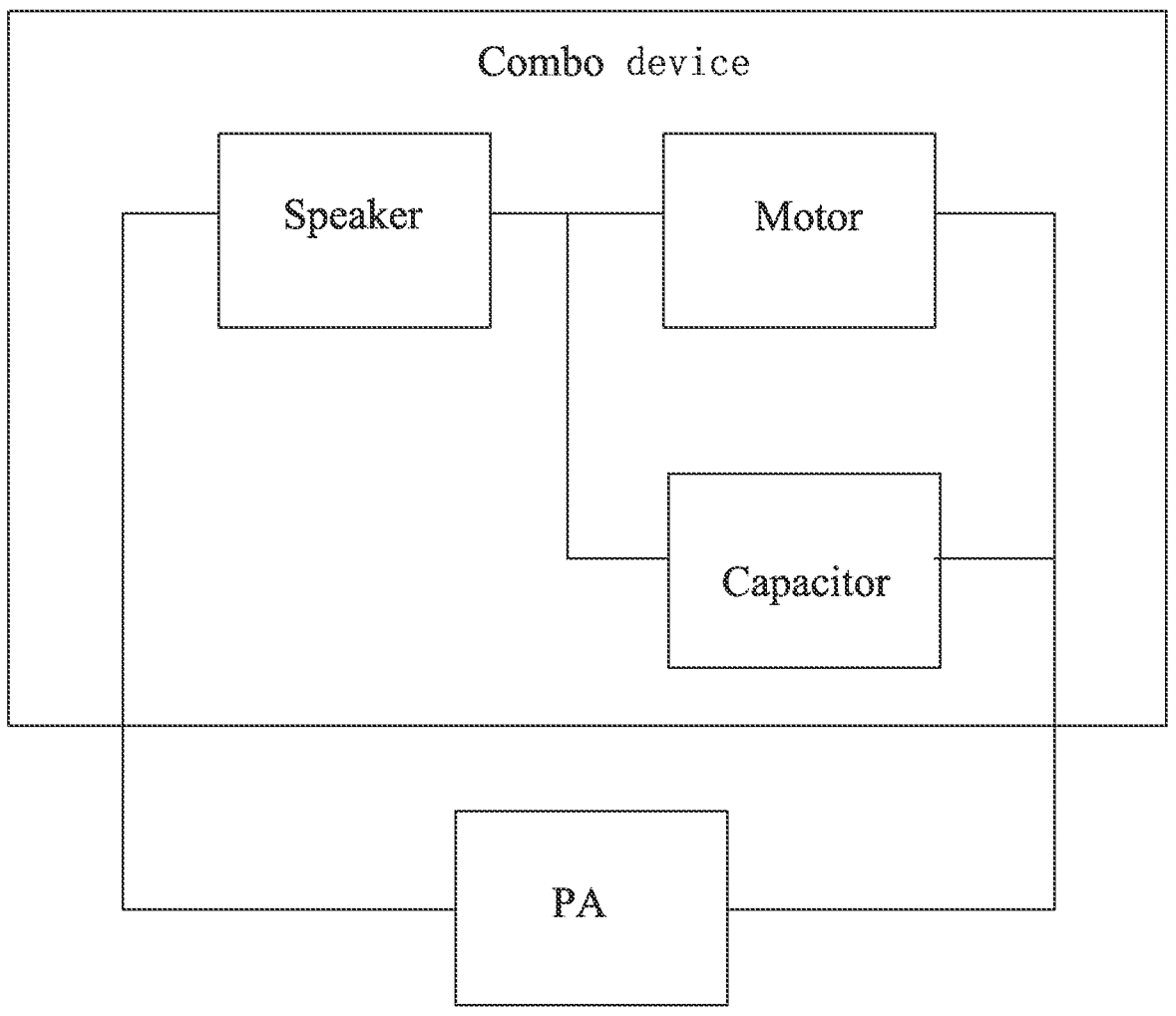
FIG. 1 is a structural schematic diagram of a device according to a first embodiment of the present disclosure.

In order to solve a problem in the related art that accuracy of speaker displacement protection is low and relatively large loss on speaker sound loudness is caused due to forming a displacement protection model with a single speaker, a first embodiment of the present disclosure provides a speaker displacement protection method, applied to a device, as shown in FIG. 1, FIG. 1 is a structural schematic diagram of the device according to the first embodiment of the present disclosure. The device includes a combination device (Combo device) and a power amplifier (PA), the combination device includes a speaker and a motor. Moreover, in the embodiment, the combination device further includes a capacitor, after the power amplifier sends out an analog signal, the analog signal is divided by the capacitor and then respectively loaded at both ends of the speaker and motor. As shown in FIG. 2, FIG. 2 is a schematic flowchart of a speaker displacement protection method according to the first embodiment of the present disclosure, and the speaker displacement protection method includes following steps.

Step 201: creating a target transfer function based on a real-time amplitude of the speaker and a fusion voltage relative to the combination device.

Specifically, in the embodiment, the motor and the speaker are first modeled, and a transfer function of the real-time amplitude of the speaker and a fusion voltage relative to the combination device are obtained according to an amplitude model of the motor and the speaker.

In some embodiments of the embodiment, the step 201 of creating the target transfer function based on the real-time amplitude of the speaker and the fusion voltage relative to the combination device includes according to a predetermined state equation, creating a first transfer function of the fusion voltage relative to the combination device and a first real-time voltage of the speaker; performing data fitting on the real-time amplitude of the speaker and the first real-time voltage of the speaker to create a second transfer function; and creating the target transfer function through combining the first transfer function and the second transfer function.

Specifically, in the embodiment, the target transfer function is created based on the first transfer function of the first real-time voltage of the speaker and the fusion voltage relative to the combination device and the second transfer function of the real-time amplitude of the speaker and the first real-time voltage of the speaker. The transfer function of the voltage of the speaker and the fusion voltage relative to the combination device is a partial pressure of the combination device and is obtained through the determined state equation; and the transfer function of the amplitude of the speaker and the voltage of the speaker is obtained through real-time data fitting. Therefore, the embodiment not only introduces a partial pressure model, but also introduces the amplitude model of the motor and the speaker, so that the target transfer function is more accurate.

Furthermore, in some embodiments of the embodiment, the target transfer function is illustrated as follow:

$$\hat{H}_x(f, t) = C(f, t) H_x(f) = \frac{U(f)}{\hat{U}(f)} \cdot \frac{X(f)}{U(f)} = \frac{X(f)}{\hat{U}(f)};$$

where, $\hat{H}_x(f,t)$ illustrates the target transfer function, $C(f,t)$ illustrates the first transfer function, $H_x(f)$ illustrates the second transfer function, illustrates the fusion voltage relative to the combination device, $U(f)$ illustrates the voltage of the speaker, and illustrates the amplitude of the speaker.

Specifically, in the embodiment, when the single power amplifier drives the combination device, the voltage of the speaker cannot be directly obtained, so that the transfer function of the amplitude of the speaker and the fusion voltage relative to the combination device includes the transfer function of the voltage of the speaker and the fusion voltage relative to the combination device and the transfer function of the amplitude of the speaker and the voltage of the speaker, the transfer function of the voltage of the speaker and the fusion voltage relative to the combination device and the transfer function of the amplitude of the speaker and the voltage of the speaker are connected in series to form the transfer function of the amplitude of the speaker and the fusion voltage relative to the combination device.

Step 202: determining target gains according to the target transfer function and a predetermined displacement threshold.

Specifically, in the embodiment, a predetermined displacement of the speaker is obtained through a created transfer function, and a compression gain of an audio signal is determined according to the predetermined displacement of the speaker and the predetermined displacement threshold.

In some embodiments of the present disclosure, the step 202 of determining the target gains according to the target transfer function and the predetermined displacement threshold includes obtaining a first predicted displacement of the speaker based on the target transfer function and the fusion voltage relative to the combination device; correcting the first predicted displacement of the speaker to obtain a second predicted displacement of the speaker; comparing the second predicted displacement of the speaker with the predetermined displacement threshold to obtain displacement difference; and adjusting a parameter of a band-pass filter according to the displacement difference to obtain the target gains, where the band-pass filter is configured to compress a voltage at a resonant frequency of the speaker.

Specifically, in the embodiment, a predicted displacement of the speaker is obtained by a displacement prediction model, the displacement prediction model has two modes of feedforward and feedback, and obtaining the first predicted displacement of the speaker through the target transfer function and the fusion voltage relative to the combination device is the mode of feedforward, since the target transfer function is a theoretical model and cannot completely and accurately predict an actual displacement of the speaker, the first predicted displacement of the speaker needs to be corrected to obtain the second predicted displacement of the speaker, that is, a real-time displacement of the speaker. Then, the second predicted displacement of the speaker is compared with the predetermined displacement threshold to obtain the displacement difference, and the parameter of the band-pass filter is adjusted according to the displacement difference to obtain the target gains.

Furthermore, in some embodiments of the embodiment, after comparing the second predicted displacement of the speaker with the predetermined displacement threshold to obtain the displacement difference, the speaker displacement protection method further includes comparing the displacement difference with a predetermined displacement difference threshold, when the displacement difference is greater than the predetermined displacement threshold, adjusting the parameter of the band-pass filter according to the displacement difference to obtain the target gains.

Specifically, in the embodiment, the predicted displacement of the speaker is compared with the predetermined displacement threshold to determine whether displacement compression is needed. When the displacement difference between the predicted displacement of the speaker and the predetermined displacement threshold is greater than a certain value, the predicted displacement of the speaker is determined to be greater than the predetermined displacement threshold, so that the displacement compression is needed, and the parameter of the band-pass filter is adjusted according to the displacement difference, so that the compression gain of the audio signal is determined.

Furthermore, in some embodiments of the embodiment, the correcting the first predicted displacement of the speaker to obtain the second predicted displacement of the speaker includes obtaining a real-time current of the speaker and a second real-time voltage of the speaker; and correcting the first predicted displacement of the speaker according to the real-time current of the speaker and the second real-time voltage of the speaker to obtain the second predicted displacement of the speaker.

Specifically, in the embodiment, the first predicted displacement of the speaker obtained based on the target transfer function is corrected through the real-time current of the speaker and a real-time voltage of the speaker, so that the amplitude model of the motor and the speaker is more accurate.

Furthermore, in some embodiments of the embodiment, the determining the target gains according to the target transfer function and the predetermined displacement threshold includes performing frequency division on the original audio signal input to the combination device to obtain frequency band signals; and determining the target gains respectively corresponding to the frequency band signals according to the target transfer function and the predetermined displacement threshold.

Specifically, in the embodiment, the frequency division is performed on the original audio signal input to the combination device to obtain a plurality of frequency band information, and he plurality of the frequency band information may be frequency band signals having consistent phase, and the target gains respectively corresponding the frequency band signals are determined according to the target transfer function and the predetermined displacement threshold.

Step 203: performing gain processing on an original audio signal input to the combination device based on the target gains, so as to provide displacement protection for the speaker.

Figure 3:
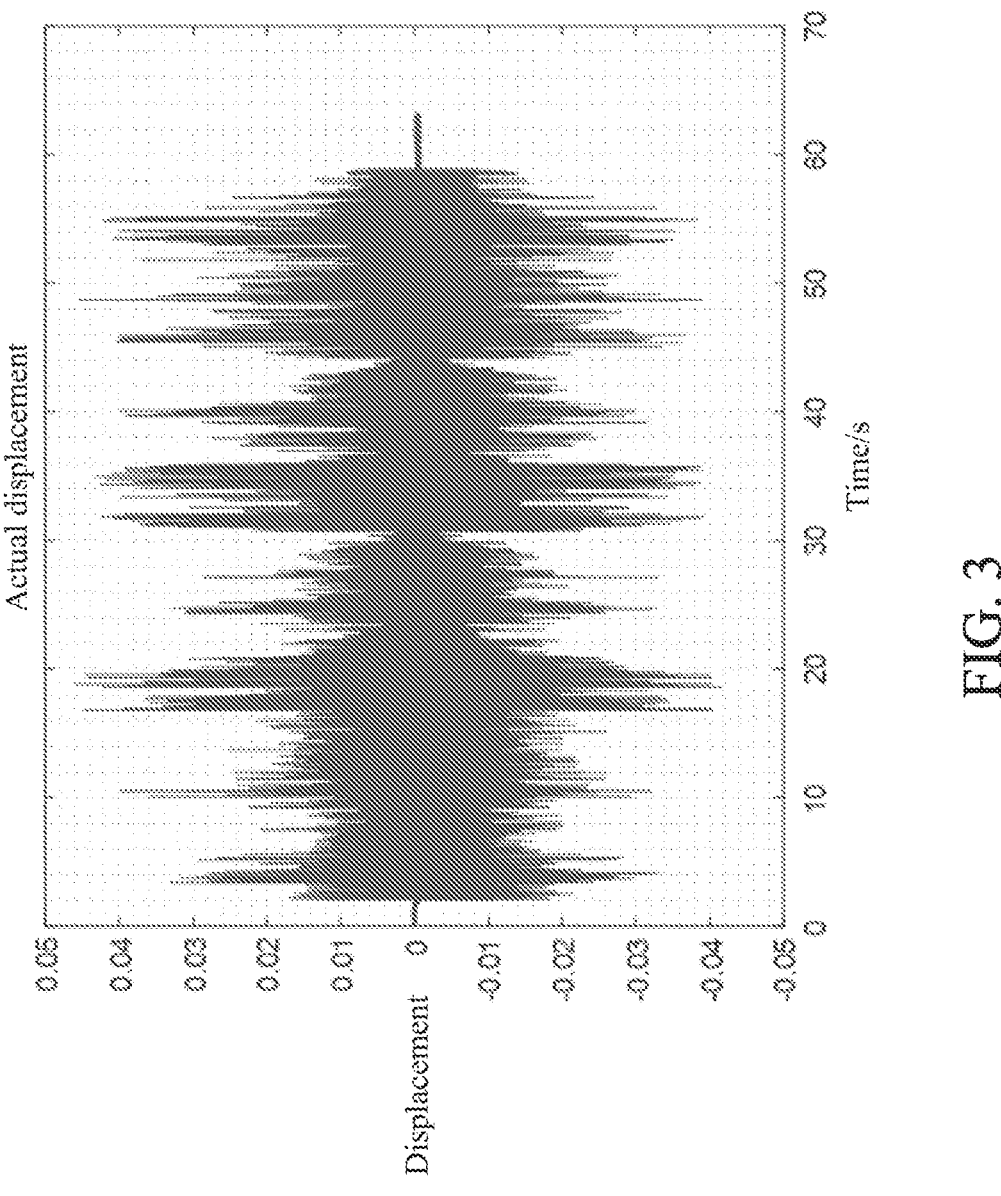
FIG. 3 is a schematic diagram of distribution of an actual displacement of a speaker according to the first embodiment of the present disclosure.
Figure 4:
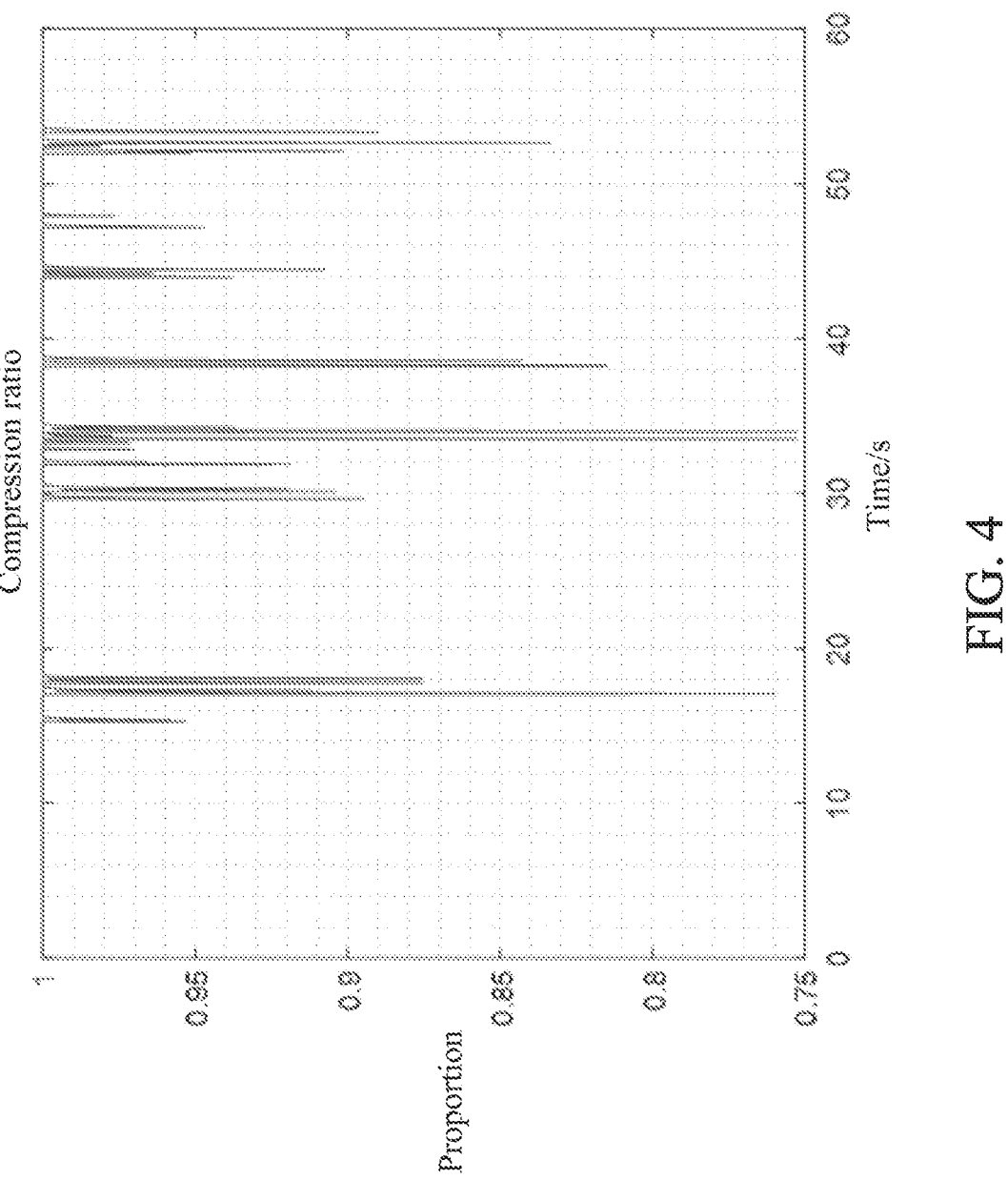
FIG. 4 is a schematic diagram of a displacement compression result of the speaker according to the first embodiment of the present disclosure.

Specifically, in the embodiment, the parameter of the band-pass filter is adjusted to obtain a corresponding compression gain, and the corresponding compression gain is then used to compress and filter the original audio signal to generate a compression signal, so as to provide the displacement protection for the speaker. For example, as shown in FIG. 3, FIG. 3 is a schematic diagram of distribution of the actual displacement of the speaker, in which an abscissa illustrates a transmission time with a unit of s and an ordinate illustrates a displacement of the speaker with a unit of mm, after the displacement of speaker is processed, as a displacement compression result of the speaker shown in FIG. 4, in which an abscissa illustrates a transmission time with a unit of s and an ordinate illustrates a proportion after a displacement protection module based on the partial pressure of the speaker is provided, loudness of the speaker is ensured, and the displacement of the speaker is also effectively compressed.

In some embodiments of the embodiment, the performing the gain processing on the original audio signal input to the combination device based on the target gains includes performing the gain processing on the frequency band signals of the original audio signal input to the combination device through using the target gains in sequence according to a predetermined sequence.

Specifically, in the embodiment, the target gains corresponding to different frequency band signals may be different, therefor the predetermined sequence is provided, the frequency band signals which cause the displacement of the speaker to exceed the predetermined displacement threshold is prioritized to process, so as to better protect the speaker.

According to technical solutions of the present disclosure, the speaker displacement protection method, a speaker displacement protection device, an electronic device, and a computer-readable storage medium are provided. The target transfer function is created based on the real-time amplitude of the speaker and the fusion voltage relative to the combination device, the target gains are determined according to the target transfer function and the predetermined displacement threshold, and the gain processing is performed on the original audio signal input to the combination device based on the target gains, so as to provide the displacement protection for the speaker. According to the present disclosure, the target transfer function is created according to an amplitude model of the speaker and the motor, and the target gains are determined according to the target transfer function and the predetermined displacement threshold for performing the gain processing on the original audio signal input to the combination device, so that accuracy of the speaker displacement protection is improved while audio distortion is reduced.

As shown in FIG. 5, FIG. 5 is a schematic flowchart of a detailed speaker displacement protection method according to a second embodiment of the present disclosure, and the detailed speaker displacement protection includes following steps.

Step 501: according to the predetermined state equation, creating the first transfer function of the fusion voltage relative to the combination device and the first real-time voltage of the speaker.

Step 502: performing the data fitting on the real-time amplitude of the speaker and the first real-time voltage of the speaker to create the second transfer function.

Step 503: creating the target transfer function through combining the first transfer function and the second transfer function.

Step 504: correcting the first predicted displacement of the speaker obtained based on the target transfer function and the fusion voltage relative to the combination device to obtain the second predicted displacement of the speaker.

Step 505: comparing the second predicted displacement of the speaker with the predetermined displacement threshold to obtain the displacement difference.

Step 506: adjusting the parameter of the band-pass filter according to the displacement difference to obtain the target gains.

Step 607: performing the gain processing on the original audio signal input to the combination device based on the target gains, so as to provide the displacement protection for the speaker.

Figure 6:
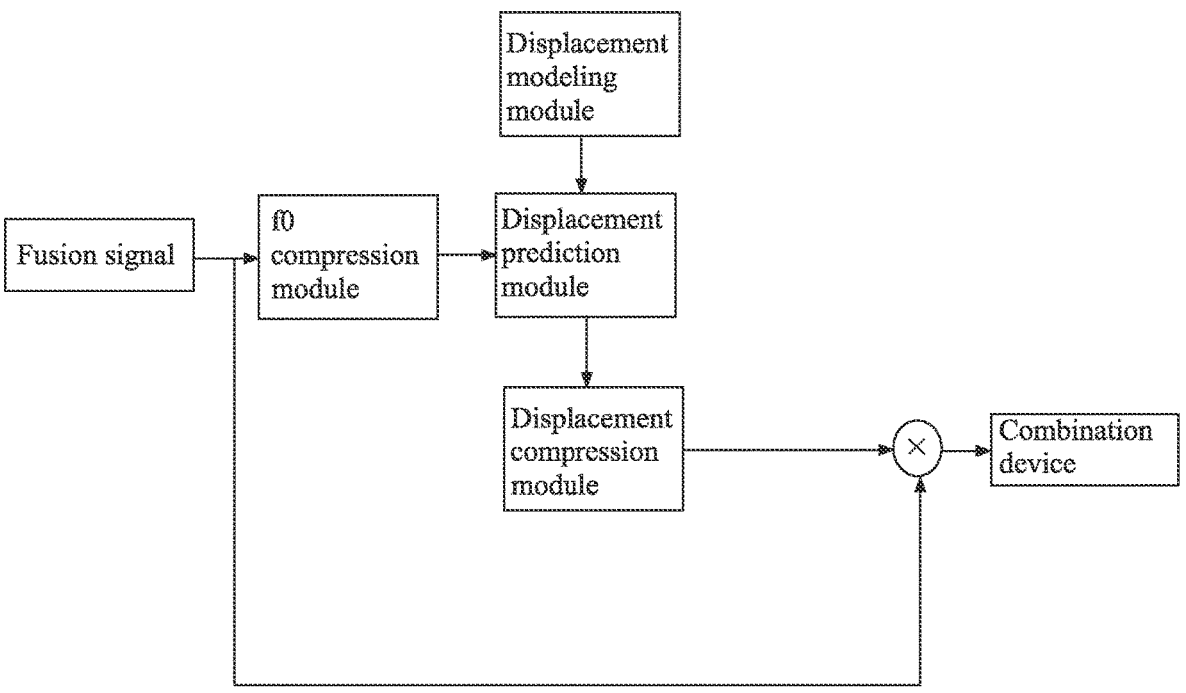
FIG. 6 is a module schematic diagram of a speaker displacement protection device of a combination device with a single power amplifier according to the second embodiment of the present disclosure.

Specifically, in the embodiment, the above steps are applied to a speaker displacement protection device in a combination device with a single power amplifier, the speaker displacement protection device includes a main link, sub-links, a resonant frequency (f0) compression module, a displacement (amplitude) modeling module, displacement prediction modules, and a displacement compression module. In particular, the sub-links are respectively connected to the main link in parallel, output ends of the sub-links are connected to an input end of the displacement compression module, the displacement compression module is disposed in the main link, an input end of the displacement compression module is configured to receive the original audio signal, an output end of the displacement compression module is connected to the speaker, and an input end of the displacement compression module is further connected to an output end of the f0 compression module. The displacement modeling module is disposed in one of the sub-links, and the displacement prediction modules are respectively disposed in the rest of the sub-links in series. As shown in FIG. 6, FIG. 6 is a module schematic diagram of the speaker displacement protection device of the combination device with the single power amplifier, in which fusion signal refers to fusion signals of the speaker and the motor, and a compression signal obtained by multiplying the compression gain by the fusion signal is input into the combination device. The displacement modeling module is configured to create a transfer function of the amplitude of the speaker and the fusion voltage relative to the combination device, the f0 compression module is configured to limit a voltage at a resonant frequency, and the f0 compression module is a band-pass filter. In addition, the speaker displacement protection device further includes a frequency division module, the frequency division module is disposed between the f0 compression module and the displacement compression module, and is configured to perform the frequency division on the original audio signal. The displacement compression module is configured to perform the gain processing on the original audio signal through the target gains. The displacement prediction model has two modes of feedback and feedforward, in which the mode of feedback enables the displacement prediction model to be more accurate through continuously correcting errors of the amplitude modeling module by feeding back currents and voltages.

It should be understood that the sequence of serial numbers of steps in the embodiment is not the execution sequence of the steps, the execution sequence of the steps should be determined by its function and internal logic, and an implementation process of the embodiments of the present disclosure should not be uniquely limited.

According to technical solutions of the second embodiment of the present disclosure, according to the predetermined state equation, the first transfer function of the fusion voltage relative to the combination device and the first real-time voltage of the speaker is created, the data fitting is performed on the real-time amplitude of the speaker and the first real-time voltage of the speaker to create the second transfer function, the target transfer function is created through combining the first transfer function and the second transfer function, the first predicted displacement of the speaker obtained based on the target transfer function and the fusion voltage relative to the combination device is corrected to obtain the second predicted displacement of the speaker, the second predicted displacement of the speaker is compared with the predetermined displacement threshold to obtain the displacement difference, the parameter of the band-pass filter is adjusted according to the displacement difference to obtain the target gains, and the gain processing is performed on the original audio signal input to the combination device based on the target gains, so as to provide the displacement protection for the speaker. In the embodiment, the partial pressure model is connected to the displacement protection model in series, the predicted displacement of the speaker is obtained through transfer functions, the parameter of the band-pass filter is adjusted according to an overload condition of the predicted displacement, a purpose of reducing a displacement of a terminal speaker through controlling an output voltage of the original audio signal input to the combination device is achieved, and the speaker is protected from permanent damage caused by mechanical overload.

Figure 7:
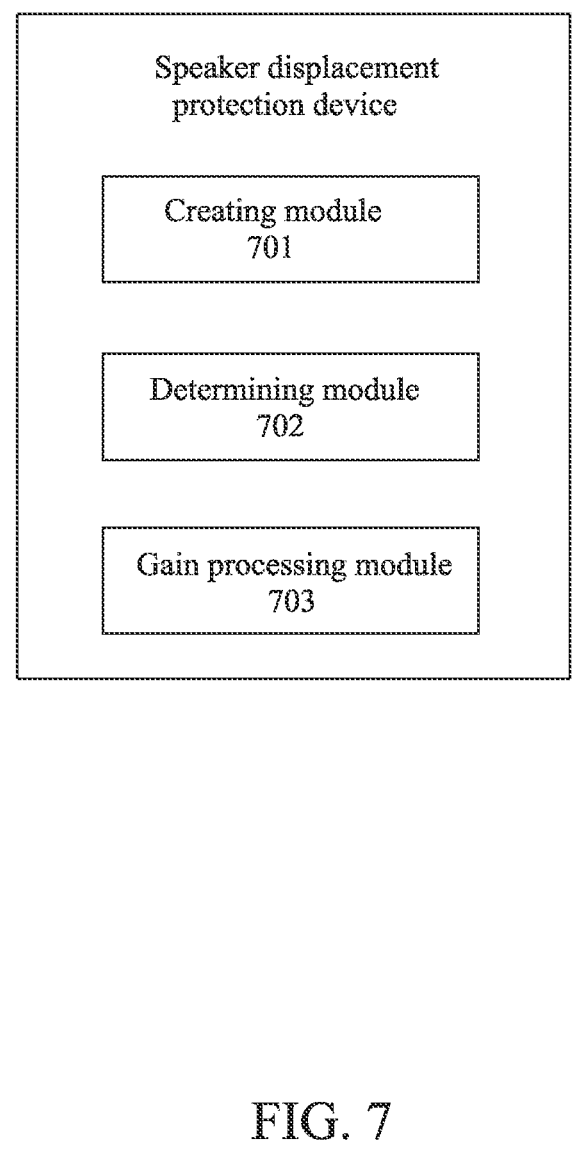

FIG. 7 is a module schematic diagram of the speaker displacement protection device according to a third embodiment of the present disclosure, applied to a device, the device includes a power amplifier and a combination device, and the combination device includes a speaker and a motor. The speaker displacement protection device is applied to the speaker displacement protection method as foregoing. As shown in FIG. 7, the speaker displacement protection device mainly includes a creating module 701, a determining module 702, and a gain processing module 703. The creating module 701 is configured to create a target transfer function based on a real-time amplitude of the speaker and a fusion voltage relative to the combination device, the determining module 702 is configured to determine target gains according to the target transfer function and a predetermined replacement threshold, and the gain processing module 703 is configured to perform gain processing on an original audio signal input to the combination device based on the target gains, so as to provide displacement protection for the speaker.

In some embodiments of the embodiment, the creating module 701 is specifically configured to, according to a predetermined state equation, create a first transfer function of the fusion voltage relative to the combination device and a first real-time voltage of the speaker, perform data fitting on the real-time amplitude of the speaker and the first real-time voltage of the speaker to create a second transfer function, and create the target transfer function through combining the first transfer function and the second transfer function. The target transfer function is illustrated as follow.

$$\hat{H}_x(f,t) = C(f,t)H_x(f) = \frac{U(f)}{\hat{U}(f)} \cdot \frac{X(f)}{U(f)} = \frac{X(f)}{\hat{U}(f)};$$

where, $\hat{H}_x(f,t)$ illustrates the target transfer function, C(f,f) illustrates the first transfer function, $H_x(f)$ illustrates the second transfer function, illustrates the fusion voltage relative to the combination device, U(f) illustrates a voltage of the speaker, and illustrates an amplitude of the speaker.

In some embodiments of the embodiment, the determining module 702 is configured to obtain a first predicted displacement of the speaker based on the target transfer function and the fusion voltage relative to the combination device, correct the first predicted displacement of the speaker to obtain a second predicted displacement of the speaker, compare the second predicted displacement of the speaker with the predetermined displacement threshold to obtain displacement difference, and adjust a parameter of a band-pass filter according to the displacement difference to obtain the target gains, where the band-pass filter is configured to compress a voltage at a resonant frequency of the speaker.

Furthermore, in some embodiments of the embodiment, the speaker displacement protection device further includes a comparison module configured to compare the displacement difference with a predetermined displacement difference threshold, when the displacement difference is greater than the predetermined displacement threshold, adjust a parameter of the band-pass filter according to the displacement difference to obtain the target gains Furthermore, in some embodiments of the embodiment, the speaker displacement protection device further includes a correction module, configured to obtain a real-time current of the speaker and a second real-time voltage of the speaker, and correct the first predicted displacement of the speaker according to the real-time current of the speaker and the second real-time voltage of the speaker to obtain the second predicted displacement of the speaker.

Furthermore, in other embodiments of the embodiment, the determining module 702 is further configured to perform frequency division on the original audio signal input to the combination device to obtain frequency band signals, and determine the target gains respectively corresponding to the frequency band signals according to the target transfer function and the predetermined displacement threshold.

In some embodiments of the embodiment, the gain processing module is specifically configured to perform the gain processing on the frequency band signals of the original audio signal input to the combination device through using the target gains in sequence according to a predetermined sequence.

It should be noted that the speaker displacement protection method in the foregoing embodiments may be implemented based on the speaker displacement protection device provided in the embodiment, and those who skilled in the art may clearly understand that, for convenience and brevity of description, a specific working process of the speaker displacement protection device described in the embodiment may refer to the corresponding process in the foregoing method embodiments, and details are not described herein again.

According to the technical solutions of the third embodiment of the present disclosure, the target transfer function is created based on the real-time amplitude of the speaker and the fusion voltage relative to the combination device, the target gains are determined according to the target transfer function and the predetermined displacement threshold, and the gain processing is performed on the original audio signal input to the combination device based on the target gains, so as to provide the displacement protection for the speaker. According to the present disclosure, the target transfer function is created according to an amplitude model of the speaker and the motor, and the target gains are determined according to the target transfer function and the predetermined displacement threshold for performing the gain processing on the original audio signal input to the combination device, so that accuracy of the speaker displacement protection is improved while audio distortion is reduced.

Figure 8:
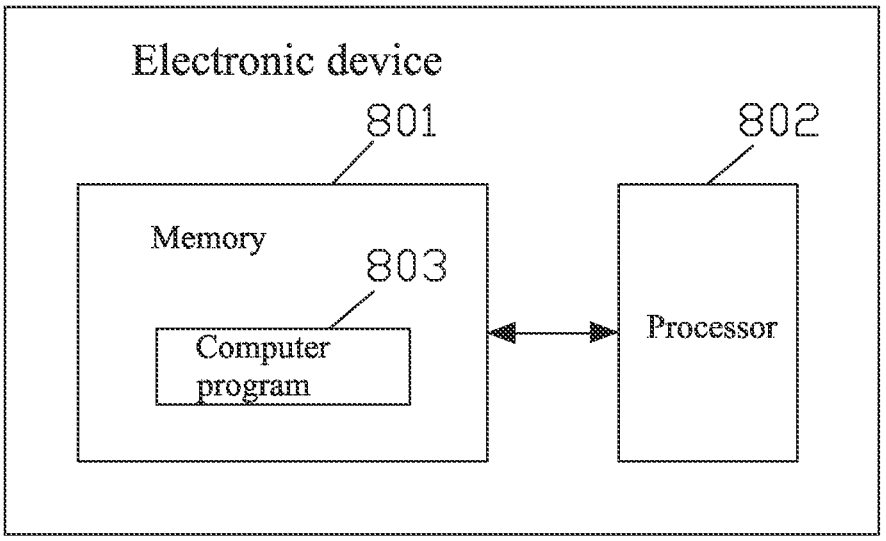
FIG. 8 is a structural schematic diagram of an electronic device according to a fourth embodiment of the present disclosure.

FIG. 8 is a structural schematic diagram of an electronic device according to a fourth embodiment of the present disclosure, the electronic device is configured to execute the speaker displacement protection method as foregoing, mainly including a memory 801, a processor 802, and a computer program 803. The memory 801 and the processor 802 are communicatively connected. The processor 802 executes the computer program 803 to execute the speaker displacement protection method as mentioned in the first embodiment or the second embodiment, where one or more processors may be provided.

The memory 801 is selected from a high-speed random access memory (RAM) and a non-volatile memory, such as a disk memory. The memory 801 is configured to store executable program code, and the processor 802 is coupled to the memory 801.

Furthermore, the embodiments of the present disclosure further provide a computer-readable storage medium, the computer-readable storage medium is disposed in the electronic device, and the computer program may be the processor 901 as shown in FIG. 8.

The computer-readable storage medium includes a computer program, and the computer program is executed by a processor to execute the speaker displacement protection method as foregoing. Furthermore, the computer-readable storage medium is elected from various media that may store program codes, such as a USB flash disk, a mobile hard disk, a read-only memory (ROM), a RAM, a disk, a compact disc, etc.

In the embodiments provided in the present disclosure, it should be understood that the disclosed device and method may be implemented in other manners. For example, the embodiments about the device described above are merely illustrative, for example, the division of modules is merely a logical function division, and there may be another division manner during actual implementation, for example, multiple modules or components may be combined or may be integrated into another system, or some features may be ignored, or not performed. Moreover, the displayed or discussed mutual coupling or direct coupling or communication connection may be an indirect coupling or communication connection through some interfaces, devices, or modules, and may be electrical, mechanical, or other forms.

Modules described as separate components may or may not be physically separated, and components displayed as modules may or may not be physical modules, that is, may be located in one place, or may be distributed on multiple network modules. Some or all of the modules may be selected according to actual needs to achieve objectives of solutions of the embodiments.

In addition, functional modules in the embodiments of the present disclosure may be integrated into one processing module, or each of the modules may exist alone physically, or two or more modules may be integrated into one module. The integrated module may be implemented in a form of hardware, or may be implemented in a form of a software functional module.

When the integrated module is implemented in the form of the software functional module and sold or used as an independent product, the integrated module may be stored in a computer-readable storage medium. Based on this understanding, all or part of the technical solutions, contributing to the related art, of the present disclosure or all or part of the technical solution can be embodied in the form of a computer software product, and the computer software product is stored in a readable storage medium, and includes several instructions for enabling a computer device such as a personal computer, a server, or a network device, etc., to perform all or part of the steps of the methods of the embodiments of the present disclosure. The foregoing computer-readable storage medium includes various media that may store program codes, such as a USB flash disk, a mobile hard disk, a ROM, a RAM, a disk, a compact disc, etc.

It should be noted that, for the foregoing embodiments about method, for ease of description, all of the foregoing embodiments about method are expressed as a series of action combinations, but those who skilled in the art should understand that the present disclosure is not limited by the described action sequence, since some steps may be performed in other sequences or simultaneously according to the present disclosure. Moreover, those who skilled in the art should also know that the embodiments described in the specification are all preferred embodiments, and the involved actions and modules are not necessarily required in the present disclosure.

In the foregoing embodiments, the descriptions of the various embodiments are emphasized respectively, and some parts that are not described in detail in some embodiments may refer to related descriptions of other embodiments.

The foregoing is a description of the speaker displacement protection method, the speaker displacement protection device, the electronic device, and the computer-readable storage medium provided by the present disclosure, and for those who skilled in the art, according to the idea of the embodiments of the present disclosure, changes may be made on specific implementation methods and application ranges, and in summary, the content of the present specification should not be construed as limiting the present disclosure.

What is claimed is:

1. A speaker displacement protection method, applied to a device comprising a power amplifier and a combination device comprising a speaker and a motor, comprising:

creating a target transfer function based on a real-time amplitude of the speaker and a fusion voltage relative to the combination device;

determining target gains according to the target transfer function and a predetermined displacement threshold; and performing gain processing on an original audio signal input to the combination device based on the target gains, so as to provide displacement protection for the speaker;

wherein the determining the target gains according to the target transfer function and the predetermined displacement threshold comprises:

according to a predetermined state equation, creating a first transfer function of the fusion voltage relative to the combination device and a first real-time voltage of the speaker;

performing data fitting on the real-time amplitude of the speaker and the first real-time voltage of the speaker to create a second transfer function; and creating the target transfer function through combining the first transfer function and the second transfer function.

2. The speaker displacement protection method according to claim 1, wherein the target transfer function is illustrated as follow:

$$\hat{H}_x(f, t) = C(f, t)H_x(f) = \frac{U(f)}{\hat{U}(f)} \cdot \frac{X(f)}{U(f)} = \frac{X(f)}{\hat{U}(f)};$$

where, $\hat{H}_x(f,t)$ illustrates the target transfer function, $C(f,t)$ illustrates the first transfer function, $H_x(f)$ illustrates the second transfer function, illustrates the fusion voltage relative to the combination device, illustrates a voltage of the speaker, and illustrates an amplitude of the speaker.

3. The speaker displacement protection method according to claim 1, wherein the determining the target gains according to the target transfer function and the predetermined displacement threshold comprises:

obtaining a first predicted displacement of the speaker based on the target transfer function and the fusion voltage relative to the combination device;

correcting the first predicted displacement of the speaker to obtain a second predicted displacement of the speaker;

comparing the second predicted displacement of the speaker with the predetermined displacement threshold to obtain displacement difference; and adjusting a parameter of a band-pass filter according to the displacement difference to obtain the target gains, where the band-pass filter is configured to compress a voltage at a resonant frequency of the speaker.

4. The speaker displacement protection method according to claim 3, wherein after comparing the second predicted displacement of the speaker with the predetermined displacement threshold to obtain the displacement difference, the speaker displacement protection method further comprises:

comparing the displacement difference with a predetermined displacement difference threshold; and when the displacement difference is greater than the predetermined displacement threshold, adjusting the parameter of the band-pass filter according to the displacement difference to obtain the target gains.

5. The speaker displacement protection method according to claim 3, wherein the correcting the first predicted displacement of the speaker to obtain the second predicted displacement of the speaker comprises:

obtaining a real-time current of the speaker and a second real-time voltage of the speaker; and correcting the first predicted displacement of the speaker according to the real-time current of the speaker and the second real-time voltage of the speaker to obtain the second predicted displacement of the speaker.

6. The speaker displacement protection method according to claim 1, wherein the determining the target gains according to the target transfer function and the predetermined displacement threshold comprises:

performing frequency division on the original audio signal input to the combination device to obtain frequency band signals;

determining the target gains respectively corresponding to the frequency band signals according to the target transfer function and the predetermined displacement threshold; and the performing the gain processing on the original audio signal input to the combination device based on the target gains comprises:

performing the gain processing on the frequency band signals of the original audio signal input to the combination device through using the target gains in sequence according to a predetermined sequence.

* * * * *